(12) United States Patent
Birch et al.

(10) Patent No.: US 8,010,928 B1
(45) Date of Patent: Aug. 30, 2011

(54) AUTOMATICALLY ROUTING NETS ACCORDING TO PARASITIC CONSTRAINT RULES

(75) Inventors: Jeremy Birch, Bristol (GB); Mark Waller, Bristol (GB); Mark Williams, Glos (GB); Graham Balsdon, Glos (GB); Fumiaki Sato, Tokyo (JP); Tim Parker, Bristol (GB)

(73) Assignee: Pulsic Limited (GB)

( * ) Notice: Subject to any disclaimer, the term of this patent is extended or adjusted under 35 U.S.C. 154(b) by 522 days.

(21) Appl. No.: 12/048,948

(22) Filed: Mar. 14, 2008

Related U.S. Application Data

(62) Division of application No. 11/164,518, filed on Nov. 28, 2005, now Pat. No. 7,363,607.

(60) Provisional application No. 60/597,081, filed on Nov. 8, 2005.

(51) Int. Cl.
*G06F 17/50* (2006.01)
(52) U.S. Cl. ........................................ 716/126; 716/130
(58) Field of Classification Search .............. 716/12–14, 716/126, 130
See application file for complete search history.

(56) References Cited

U.S. PATENT DOCUMENTS

| | | | |
|---|---|---|---|
| 4,615,011 A | 9/1986 | Linsker | |
| 4,673,966 A | 6/1987 | Shimoyama | |
| 4,777,606 A | 10/1988 | Fournier | |
| 4,782,193 A | 11/1988 | Linsker | |
| 4,811,237 A | 3/1989 | Putatunda et al. | |
| 4,815,003 A | 3/1989 | Putatunda et al. | |
| 4,855,253 A | 8/1989 | Weber | |
| 4,965,739 A | 10/1990 | Ng et al. | |
| 5,072,402 A | 12/1991 | Ashtaputre et al. | |
| 5,272,645 A | 12/1993 | Kawakami et al. | |
| 5,353,235 A | 10/1994 | Do et al. | |
| 5,375,069 A | 12/1994 | Satoh et al. | |
| 5,500,804 A | 3/1996 | Honsinger et al. | |
| 5,541,005 A | 7/1996 | Bezama et al. | |
| 5,550,748 A | 8/1996 | Xiong | |
| 5,635,736 A | 6/1997 | Funaki et al. | |
| 5,637,920 A | 6/1997 | Loo | |
| 5,640,327 A | 6/1997 | Ting | |
| 5,646,830 A | 7/1997 | Nagano | |
| 5,650,653 A | 7/1997 | Rostoker et al. | |
| 5,689,433 A | 11/1997 | Edwards | |
| 5,723,908 A | 3/1998 | Fuchida et al. | |
| 5,757,089 A | 5/1998 | Ishizuka | |
| 5,784,289 A | 7/1998 | Wang | |
| 5,801,385 A | 9/1998 | Endo et al. | |
| 5,801,959 A | 9/1998 | Ding et al. | |
| 5,811,863 A | 9/1998 | Rostoker et al. | |
| 5,822,214 A | 10/1998 | Rostoker et al. | |
| 5,880,969 A | 3/1999 | Hama et al. | |
| 6,219,823 B1 | 4/2001 | Hama et al. | |
| 6,282,693 B1 | 8/2001 | Naylor et al. | |
| 6,301,693 B1 | 10/2001 | Naylor et al. | |
| 6,324,675 B1 | 11/2001 | Dutta et al. | |
| 6,349,403 B1 | 2/2002 | Dutta et al. | |
| 6,408,427 B1 | 6/2002 | Cong et al. | |
| 6,480,993 B1 | 11/2002 | Suto et al. | |
| 6,480,996 B1 | 11/2002 | Aji et al. | |
| 6,507,941 B1 | 1/2003 | Leung et al. | |
| 6,510,545 B1 | 1/2003 | Yee et al. | |

(Continued)

*Primary Examiner* — Stacy A Whitmore
(74) *Attorney, Agent, or Firm* — Aka Chan LLP

(57) ABSTRACT

A system of automatically routing interconnect of a integrated circuit design while taking into consideration the parasitic issues of the wiring as it is created. The system will be able to select an appropriate wiring pattern so that signals meet their performance requirements.

26 Claims, 7 Drawing Sheets

U.S. PATENT DOCUMENTS

| | | | |
|---|---|---|---|
| 6,526,555 B1 | 2/2003 | Teig et al. | |
| 6,543,043 B1 | 4/2003 | Wang et al. | |
| 6,564,366 B1 | 5/2003 | Marchenko et al. | |
| 6,598,215 B2 | 7/2003 | Das et al. | |
| 6,662,348 B1 | 12/2003 | Naylor et al. | |
| 6,671,859 B1 | 12/2003 | Naylor et al. | |
| 6,711,727 B1 | 3/2004 | Teig et al. | |
| 6,734,472 B2 | 5/2004 | Ho | |
| 6,895,567 B1 | 5/2005 | Teig et al. | |
| 7,114,141 B1 * | 9/2006 | Teig et al. | 716/12 |
| 7,131,096 B1 * | 10/2006 | Balsdon et al. | 716/13 |
| 7,246,338 B1 * | 7/2007 | Teig et al. | 716/12 |
| 7,257,797 B1 * | 8/2007 | Waller et al. | 716/14 |
| 7,373,628 B1 * | 5/2008 | Balsdon et al. | 716/13 |
| 7,480,885 B2 * | 1/2009 | Frankle et al. | 716/12 |
| 7,530,040 B1 * | 5/2009 | Balsdon et al. | 716/13 |
| 7,603,644 B2 * | 10/2009 | Waller | 716/12 |
| 7,657,852 B2 * | 2/2010 | Waller | 716/5 |
| 2004/0044979 A1 * | 3/2004 | Aji et al. | 716/13 |
| 2006/0288323 A1 * | 12/2006 | Birch | 716/12 |
| 2006/0294488 A1 * | 12/2006 | Waller | 716/13 |
| 2007/0234266 A1 * | 10/2007 | Chen et al. | 716/13 |

* cited by examiner

AUTOMATICALLY ROUTING NETS ACCORDING TO PARASITIC CONSTRAINT RULES

CROSS-REFERENCE TO RELATED APPLICATIONS

This application is a divisional of U.S. patent application Ser. No. 11/164,518, filed Nov. 28, 2005, which claims the benefit of U.S. provisional application 60/597,081, filed Nov. 8, 2005, which are incorporated by reference.

BACKGROUND OF THE INVENTION

The present invention relates to the field of electronic design automation for integrated circuits, and in particular, to the area of automatic routing of nets of interconnect taking into account parasitic constraint rules.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications or development. Higher speed internet web servers will lead to greater on-line commerce including on-line stock trading, book sales, auctions, and grocery shopping, just to name a few examples. Higher performance integrated circuits will improve the performance of the products in which they are incorporated.

Large modern day integrated circuits have millions of devices including gates and transistors and are very complex. As process technology improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire for higher integration and better performance in integrated circuits.

Within an integrated circuit, there are devices, such as transistors, and interconnect. Interconnect is used to connect signals between the circuitry and also to supply power to the circuitry. Interconnect may include metal lines, polysilicon lines, polysilicide lines, or other conductive materials. Interconnect is also sometimes referred to as nets. There may be more than one layer of interconnect, such as metal-1 and metal-2 layers. There is a need for a technique of automatically routing the interconnect of an integrated circuit. Automatic routing will automatically connect the inputs of particular devices or circuits to the appropriate outputs, typically from other circuits or devices, or from the pins of those devices.

Automatic routers are generally designed to minimize the wire length of each path routed, and so minimize the amount of space required for the circuit. However, this will tend to create dense wiring patterns with wires running for a long distance near to other wires. In modern fabrication processes this will mean that the capacitance of the signal will be significantly increased, and potentially, coupling of signals will occur (known as crosstalk).

When a signal needs to have smaller capacitance so that it can meet its performance targets, the automatic router may remove the existing wiring pattern for that signal and try to find another pattern which is better (i.e., "rip-up and reroute"). However, if the router is not conscious of the capacitance of each wiring segment as it is created, and of the impact this has upon the performance of the finished signal, then the result of rerouting will often be as bad as the original wiring.

Therefore, when automatically routing the interconnect, there is a need to create a system by which the router can understand the parasitic issues of the wiring as it is created, and for it to be able to choose wiring patterns so that the signals meet their performance requirements.

BRIEF SUMMARY OF THE INVENTION

The invention provides a system of automatically routing interconnect of an integrated circuit design while taking into consideration the parasitic issues of the wiring as it is created. The system will be able to select an appropriate wiring pattern so that signals meet their performance requirements.

The invention provides an automated technique to generate interconnect in a constraint-driven way. In an embodiment, the router will generate interconnect to account for timing performance requirements specified for one or more signal paths of an integrated circuit design. In an embodiment, this technique is implemented using a software program executing on a computer workstation. The performance requirements may be specified by a user or circuit designer.

The router may take into consideration such constraint parameters as propagation delay, capacitance, resistance, impedance, and others. A user may specify criteria for the router to satisfy or attempt to satisfy using a Boolean, regular, or other expression. For example, a parameter should be below a specified value. The router may consider two or more of these expressions at time. Further, the router program may give a user an indication of which constraints were satisfied and which constraints were not satisfied.

In a specific embodiment, the invention provides an automatic system for routing a net so that it will more nearly match timing or other parasitic dependent constraint. In an embodiment, a flow constraint-driven automatic routing is as follows: (1) Analyze constraints to the net level. (2) Estimate the distribution of the parasitics along the course of the net before it is finally routed. (3) Use this estimate to guide the final routing in an intelligent cost driven manner. (4) Measure the parasitics and consequent compliance with the constraint after final routing each net. (5) Apply further steps to improve the routing versus the constraint, and remeasure. (6) If it still fails against the constraint, reroute the net again.

In another embodiment, the invention is a method including providing an integrated circuit design space having a driving cell and a receiving cell. The driving cell and receiving cell are to be routed together using a net. The design space is divided into a plurality of bins. Parasitic values are determined for the bins. A first flood having a source edge at the driving cell and a first exit edge and a second exit edge is generated. A first timing error due to a path to the first exit edge is calculated using at least one of the previously determined parasitic values. A second timing error due to a path to the second exit edge is calculated using at least one of the previously determined parasitic values.

A second flood is generated starting from the first edge or the second edge based on a comparison of the first and second timing errors.

In another embodiment, the invention is a method including providing an integrated circuit layout having a driving cell and a receiving cell, which are to be automatically routed together using a net. Parasitics for a course of the net are estimated. After estimating parasitics, a first segment of the net is generated. Using the estimated parasitics, a second segment of the net is determined in such a way as to reduce the error against some constraint on the parasitics.

In another embodiment, the invention is an electronic automation system including a database of an integrated circuit design, a mouse input device, and a graphical user interface tool, capable of accessing and performing operations on the database, based on input from the mouse input device. The system further includes an automatic router tool, capable of accessing the database, to create a interconnect route path for at least one net of the integrated circuit design, selected using the graphical user interface tool and the mouse or otherwise, wherein the automatic router tool routes the net taking into consideration parasitic constraint rules. The database may be shape-based or gridless database or a gridded database.

In another embodiment, the invention is a method including providing an integrated circuit design having a number of source cells and sink cells to be routed using a number of nets. A source cell and sink cell pair of the plurality are identified as a critical signal path having a timing constraint. Nets between the source cells and the sink cells are automatically routed. Parasitics of the integrated circuit design are taken into consideration during routing of the critical signal path.

In another embodiment, the invention is a method of automatically routing a net between a source cell and a sink cell of an integrated circuit including estimating values of parasitics for a plurality of bins between the source cell and the sink cell. For each bin, a sensitivity value of an overall delay value to changes in values of parasitics is determined. During automatic routing of the net, decisions are made on a route for the net based on at least one sensitivity value.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
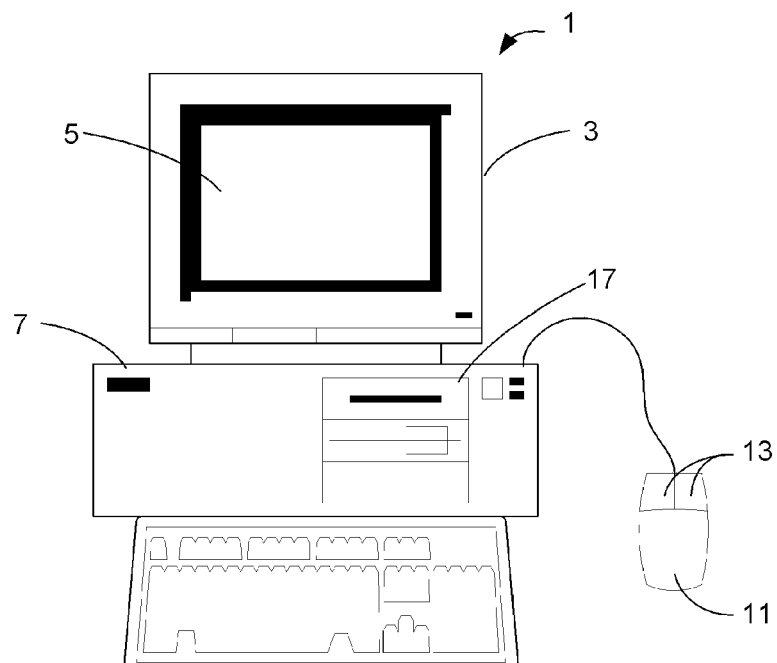
FIG. 1 shows a system of the present invention for performing electronic circuit design, including automatic interconnect routing according to parasitic constraint rules.

FIG. 1 shows an electronic design automation (EDA) system of the present invention for designing an electronic circuit or integrated circuit, including routing of nets of the circuit in a constraint-driven way. In an embodiment, the invention is software that executes on a computer workstation system, such as shown in FIG. 1. FIG. 1 shows a computer system 1 that includes a monitor 3, screen 5, cabinet 7, keyboard 9, and mouse 11. In some implementations, however, electronic design automation systems are operated headless, which means these systems will not a mouse, keyboard, display, and so forth.

Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, Iomega ZIP™ disks, magnetic disks, optical disks, fixed disks, hard disks, CD-ROMs, recordable CDs, DVDs, recordable DVDs, Flash and other nonvolatile solid-state storage, tape storage, reader, and other similar media, and combinations of these. A binary machine-executable version of the software of the present invention may be stored or reside on mass storage devices 17. Furthermore, the source code of the software of the present invention may also be stored or reside on mass storage devices 17 (e.g., magnetic disk, tape, CD-ROM, or DVD).

Figure 2:
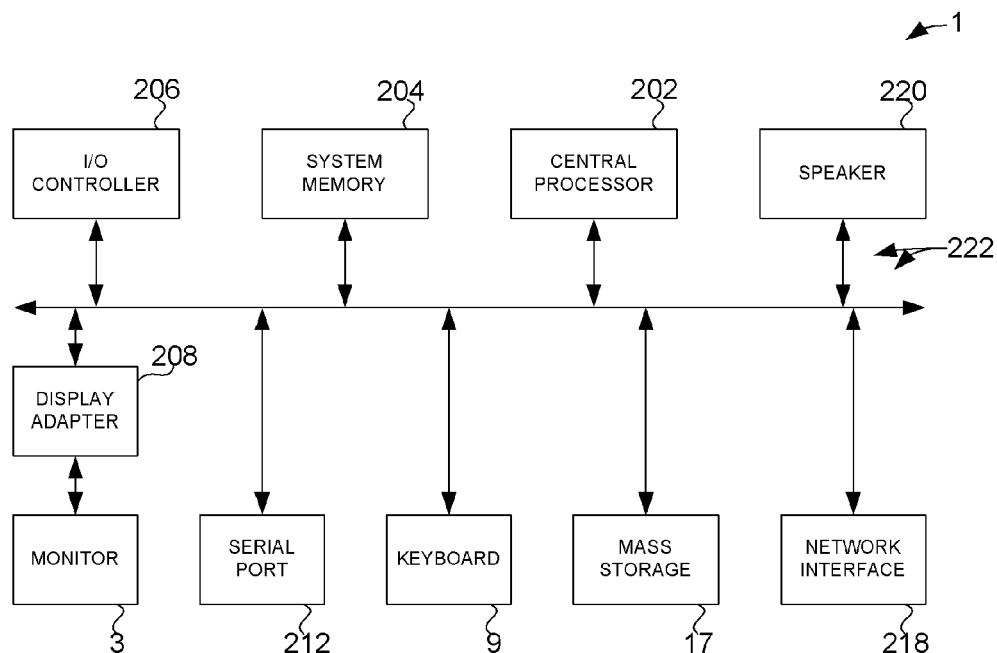
FIG. 2 shows a simplified system block diagram of computer system 1 used to execute the software of the present invention.

Further, FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

Arrows such as 222 represent the system bus architecture of computer system 1. However, these arrows are illustrative of any interconnection scheme serving to link the subsystems. For example, speaker 220 could be connected to the other subsystems through a port or have an internal connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, www.mathworks.com), SAS, SPSS, and Java. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, HPUX, UNIX, or Sun OS. Other operating systems may be used.

Furthermore, the computer may be connected to a network and may interface to other computers using this network. For example, each computer in the network may perform part of the task of the many series of automatic routing steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

Figure 3:
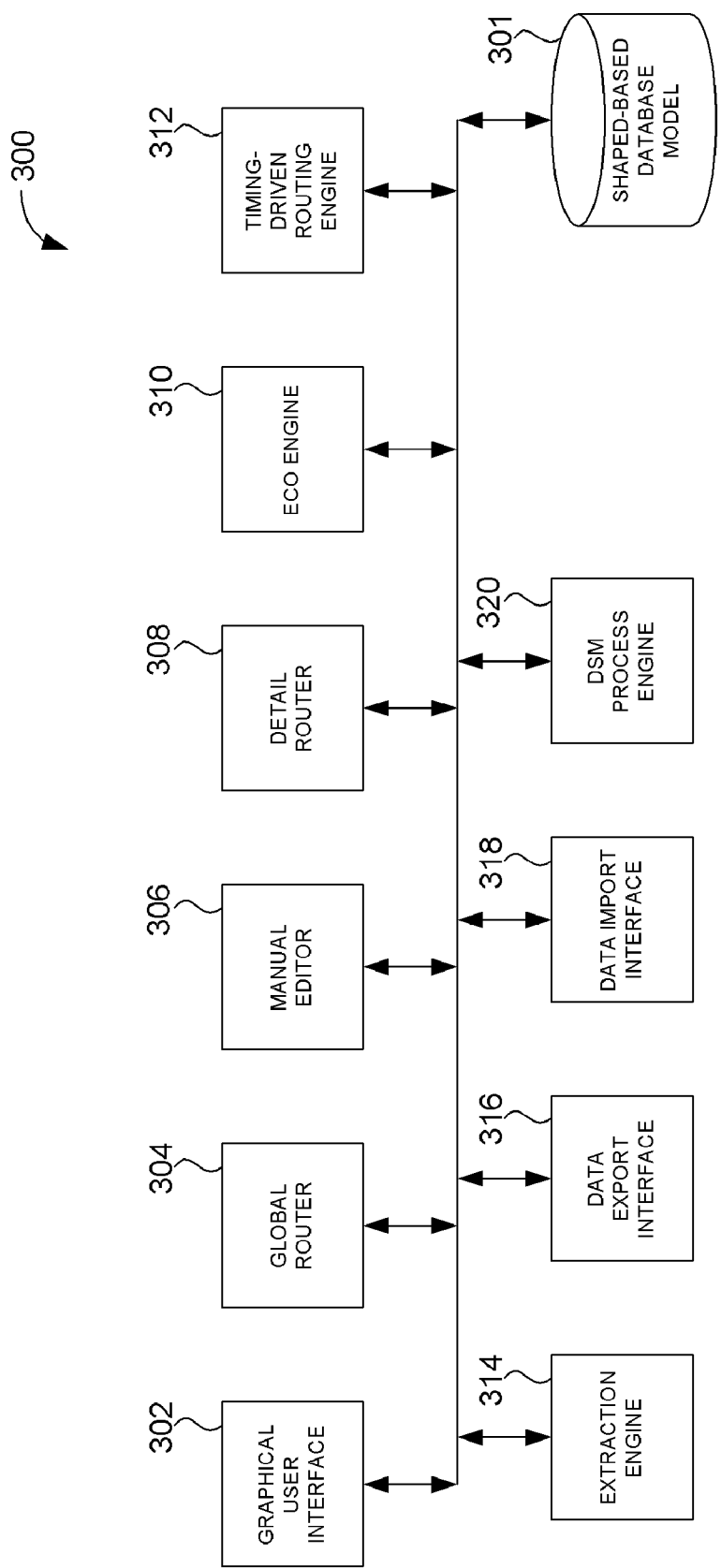
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. In other implementations, however, database model 301 may not be shape-based. Furthermore, the database is a set of information in files on disk or other media, or as structures in memory, or a combination of these, in binary or text form.

The EDA system provides such tools as a graphical user interface 302, global router 304, manual editor 306, detail router 308, engineering change order (ECO) engine 310, timing-driven routing engine 312, extraction engine 314, data export interface 316, data import engine 318, and DSM process engine 320. The silicon interface format is an example on-disk file database format, such as ASCII. However, any format may be used, including proprietary or open standards. An EDA system may include any number of the system tools shown in FIG. 3, and in any combination. Further, the EDA system may include additional tools not shown in FIG. 3.

An EDA system may be a grid-based system or shape-based system. Techniques of the present invention may be applied to a gridded or shape-based EDA system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood" operation.

The shape may be representative of any shape. For example, the shape may be a rectangle. The shape may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used such as 30 degree, 35 degree, 36 degree, 45 degree, or 60 degree) turns as needed to route around the obstacle.

Chip design, be it analog, custom or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design.

The grid-based approach offers fast routing but requires customization to handle off-grid connections and is inefficient for post-route timing and signal integrity optimizations. When net widths and spacings must be changed to reduce resistance or cross-talk, grid-based approaches waste space by moving nets to the next available grid and waste time by resorting to rip-up and re-route techniques. Gridded systems are not good at irregular intervals, irregular spacings, or routing things that do not fit onto a regular grid.

The gridless approach easily handles off-grid connections and is efficient for post-route optimizations. In a shape-based or gridless system, the layout may be a gridless layout, which means there is no grid which structures or polygon of the layout are associated with, other than the grid for the relevant manufacturing process, if any.

In an embodiment, the structure of database 301 facilitates shape-based operations. For example, a structure of this database may include an obstacle tree having nodes and leaves containing the obstacles of an integrated circuit. This tree structure permits rapid determination of where obstacles are when doing operations on the database, such as routing nets.

In FIG. 3, the EDA system 300 includes one or more of the components discussed below, in any combination. One skilled in the art will recognize that one or more of components shown in FIG. 3 may not be required to practice specific aspects of present invention. For example, when ECO engine is omitted from system, the system could still perform automatic routing of interconnect, but not be able to perform incremental netlist changes upon it.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that coarsely routes interconnects of the integrated circuit, thus enabling large designs to be routed more rapidly and completely. The global router may also provide visual and quantitative analysis of the congestion in the design by highlighting problem areas that can be fixed by incremental adjustments to the floor plan. The global router is sometimes referred to as a coarse router because it provides generally the routes for the interconnect, and may work in conjunction with a detail router 308 (discussed below) to place the geometries of the interconnect. It may make global analyses of capacity and demand, or just give ideal paths for each net, or a combination of both.

A manual editor 306 is a shape-editing suite for creating or editing metal, keep-outs, routing areas, and alter and create wires and vias, and the ability to partition a design into smaller areas. These areas can then be worked upon individually and can be recombined at a later stage to complete the design. Full on-line design rule checking (DRC) ensures that manual operations are completed error-free first time. Powerful tools automatically push-aside existing wiring to make way for new wires and semiautomatic routing tools quickly complete troublesome nets by allowing the user to guide the routing engine around complex areas of the design.

The detail router 308 is an automatic router that completes the wiring in a design by determining the specific routes for each interconnect. The detail router may complete a portion of the wiring for design, such as for sections or specified cells of the design, or may complete all the wiring of the design. The detail router may route starting from scratch or from partially completed routing. In an implementation, the global router determines the general route paths for the interconnect. The detail router takes this routing information from the global router and puts in the physical detailed geometries of the tracks and vias, deviating to some extent from the paths suggested by the global routing stage.

An engineering change order (ECO) engine 310 provides a capability to handle late stage ECO changes. Every element of the design can be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them minimizing the disruption to the design. When pushing or pulling cells, the wires may remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides parasitic or RC timing analysis of interconnects. Used in concert with the detail router, the timing engine can determine the path of least delay for critical nets. Furthermore, the timing engine, in concert with an extraction engine, can actively select a longer path with a lower associated delay (e.g., due to lower capacitance) in preference to a shorter but slower route.

An extraction engine 314 is provided. Utilizing a unified, high-speed parasitic or RC extraction engine, the crosstalk functionality accurately calculates the coupling between victim and aggressor signals. This same technology is then used to identify potential problems, and automatically implements a DRC correct solution without changing the path of the signal or other signals unnecessarily. In addition, signal-to-signal (or within and between classes of signals) spacing rules can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction information from the RC engine in order to determine whether an interconnect route meets IR drop rules, and widen the interconnect width as needed. See U.S. patent application Ser. Nos. 10/709,843 and 10/709,844, both filed Jun. 1, 2004 and incorporated by reference.

In a specific embodiment, an RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis which ensures tolerance to manufacturing variations.

The tightly coupled, high-speed RC extraction engine is used both during routing (global router or detail router, or both) and for post-routing extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool to which it is being exported.

A data import interface 318 provides the means to import data, such as a circuit layout, netlist, or design constraints. The data to be imported may be in various formats including data saved from other EDA systems or software tools. In addition, the source of the data may be a database, floppy drive, tape, hard disk drive, CD-ROM, CD-R, CD-RW, DVD, or a device over a communication network. Some examples of import formats include Verilog, GDSII, SIF, and LEF/DEF.

A DRC process engine 320 is provided. The DRC process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A user may design an integrated circuit using a system such as shown in FIG. 3. A representative flow for designing an integrated circuit is outlined in steps 1 to 8 below. Step 5 is further subdivided into three substeps.

Integrated Circuit Design Flow
 1. Provide Circuit Specification
 2. Create Circuit Design
 3. Generate Netlist
 4. Simulate Performance and Verify Functionality of Circuit Design
 5. Generate Layout 5a. Layout Devices
5b. Connect Devices Into Cells
5c. Connect Cells Into Blocks
6. Physical Verification and Design Checking
7. Create Masks
8. Fabricate Integrated Circuit Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitics and RC considerations from the layout can be back-annotated into the netlist or circuit design, and the design simulated again. The results of this simulation will presumably be more accurate because more precise information is provided.

In step 1 of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2, an engineer creates a circuit design that presumably will meet the circuit specification. This circuit design may include transistors, resistors, capacitors, and other electronic components. The engineer uses these electronic components and cells made from such devices or other cells of the design as building blocks, interconnecting them to achieve the desired functionality and performance. The engineer may make a custom design using electronic component building blocks or use a gate array, where the building blocks are sets of cells set by the gate array manufacturer. The design may be input using a graphical design tool such as schematic capture program, and any other design tool may be used. The circuit may be described using a high-level design language (HDL). These design tools will create a netlist (step 3) of the circuitry, which is a listing of the devices or cells, or both, and their interconnections.

During the design phase, the engineer simulates the performance and verifies the functionality of the circuitry (step 4). There are transistor and process models to model the components. Some simulation tools include Spice, which performs circuit simulation, and Verilog, which performs functional and timing verification. Timing constraints can be derived from simulation or static timing analysis, or from inspection of high-level constraints, or from rules of thumb or electrical rules.

After deciding upon an initial circuit design, the engineer begins layout (step 5) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layer. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5c).

In step 6, after or while the layout is generated, the physical design is verified and checked. For example, some of these operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII or other format) that is used to make the masks (step 7). The masks are used to fabricate the integrated circuit (step 8) using a photolithography process. Typically, there are many "copies" of the same integrated circuited fabricated on the same wafer. Each integrated circuit is a "die" on the wafer. Good dice are separated from the bad dice. The good dice are sawed and packaged. Packaging generally includes encapsulating the die in plastic or other material, and connecting pads of the integrated circuit to pins of the package, where the integrated circuit can be interfaced.

In electronic circuits, there are often signal paths whose specific performance limits the overall performance of the whole circuit. For instance, if a certain path is slower to evaluate than all others in the circuit then it will set the maximum speed at which the circuit can operate. Such paths are called critical paths.

While designing an electronic circuit, one of the important steps is to determine the wiring of the signal paths. The delay or other performance characteristics of the signal path is determined both by the components in that path and the wires that join them.

If a path proves to be too slow to evaluate, often designers will change the components so as to increase the signal currents. However, this approach will not solve all timing problems, particularly if the delay of the wiring itself is a significant component of the total delay. In leading geometries today, interconnect delay is a dominant factor and not necessarily gate level delay. Increasing currents takes more power, shortens battery life, increases heat dissipation, potentially increases required area and decreases reliability, all of which reduce the desirability of the product.

It is often necessary to redesign the wiring itself in such a way that the parasitics (including impedances, resistances, inductances, and capacitances) of the wiring are reduced. An automatic routing tool is needed for this task due to the complexity of the circuit, and that tool must be able to recognize which paths are to be routed and how this routing should be done so as to meet overall circuit performance targets.

Automatic routers are generally designed to minimize the wire length of each path routed, and so minimize the amount of space required for the circuit. This will tend to create dense wiring patterns with wires running for a long distance near to other wires. In modern fabrication processes this will mean that the capacitance of the signal will be significantly increased, and potentially coupling of signals will occur (known as crosstalk).

When a signal needs to have smaller parasitics (e.g., capacitance) so that it can meet its performance targets, the automatic router may remove the existing wiring pattern for that signal and try to find another pattern which is better (i.e., "rip-up and reroute"). However, if the router is not conscious of the parasitics (e.g., capacitance) of each wiring segment as it is created, and of the impact this has upon the performance of the finished signal, then the result of rerouting will often be as bad as the original wiring.

It is desirable to create a system by which the router can understand the parasitic issues of the wiring as it is created, and for it to be able to choose wiring patterns so that the signals meet their performance requirements.

Figure 4:
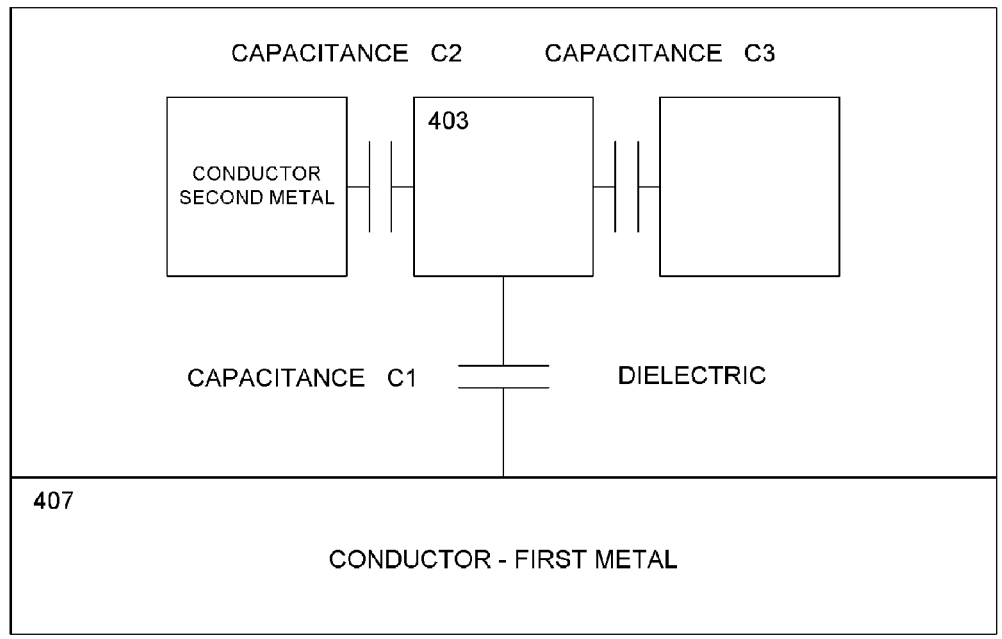
FIG. 4 shows a cross-sectional view of integrated circuit wiring.

FIG. 4 shows a cross-sectional view of integrated circuit wiring or layout. A central wire 403 on the second metal layer is part of the critical path signal. Its parasitic capacitance comprises three parts C1, C2, and C3. The first of these C1 is to wiring on a next conductor layer 407 below (or the substrate). The other two capacitances C2 and C3 are to other wires on the same wiring layer and the signal itself.

Capacitance is approximated by $C=\in A/d$. C is the capacitance per unit length of the wire, A is the facing area of the conductors, and d the distance separating them. The constant $\in$ is the permittivity of the dielectric separating the conductors.

It can be seen from the above formula that for FIG. 4, the value of C1 will be lower than either C2 or C3 because the separation of the conductors between layers is larger and the facing area is also smaller (i.e., the wires are taller than they are wide—in today's processes, wires are typically very narrow because feature sizes are shrinking). Thus, in dense wiring, most of the parasitic capacitance is to the neighboring wires on the same layer as the signal.

Figure 5:
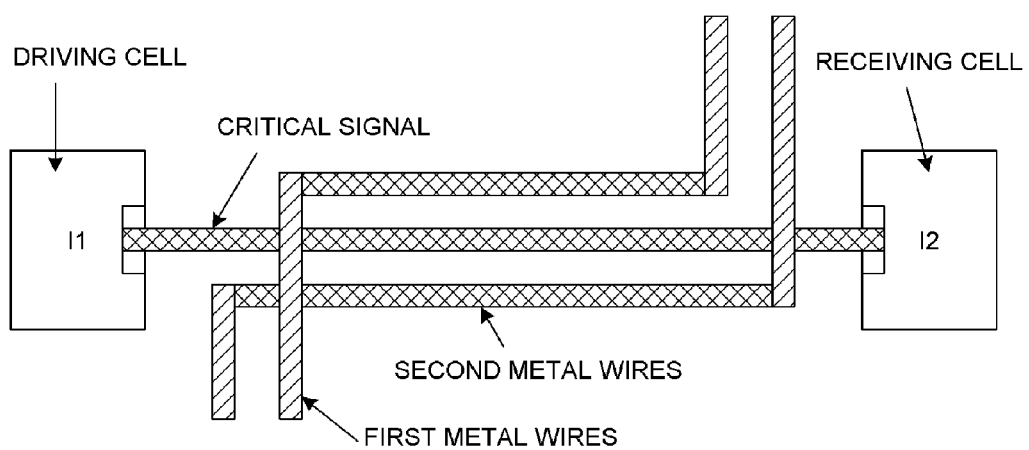
FIG. 5 shows a plan view of integrated circuit wiring.

FIG. 5 shows a signal being driven by one integrated circuit cell I1 and being received by another cell I2. The critical path involves I1, I2, and the wiring joining them. It is seen that for a large fraction of the total wire length of the signal, it is adjacent to two other signals on the same metal layer and will therefore have a significant capacitance to both of them. It is seen that the wiring of the critical signal is of minimum length and therefore if it is rerouted, it is likely to follow exactly the same course as already shown and thus rerouting will not improve the performance of the signal.

There are at least two things that can be performed here in order to reduce the parasitics of the critical signal: increase the spacing to the other nets (using the "space to timing" technique described below and shown in FIG. 6), or to find another course for the signal that is of nonminimum length but has lower parasitics than the existing course (shown in FIG. 7).

Figure 6:
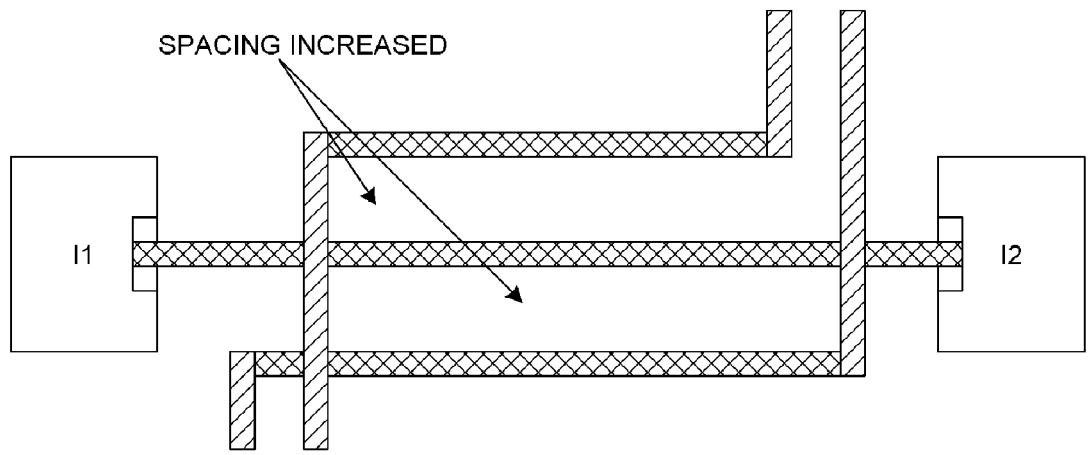
FIG. 6 shows the effects of increasing spacing.

In FIG. 6, since the spacing between the interconnects is increased, this reduces the parasitic capacitance between adjacent interconnect. The critical path will have reduced parasitic capacitance, and timing performance will improve.

Figure 7:
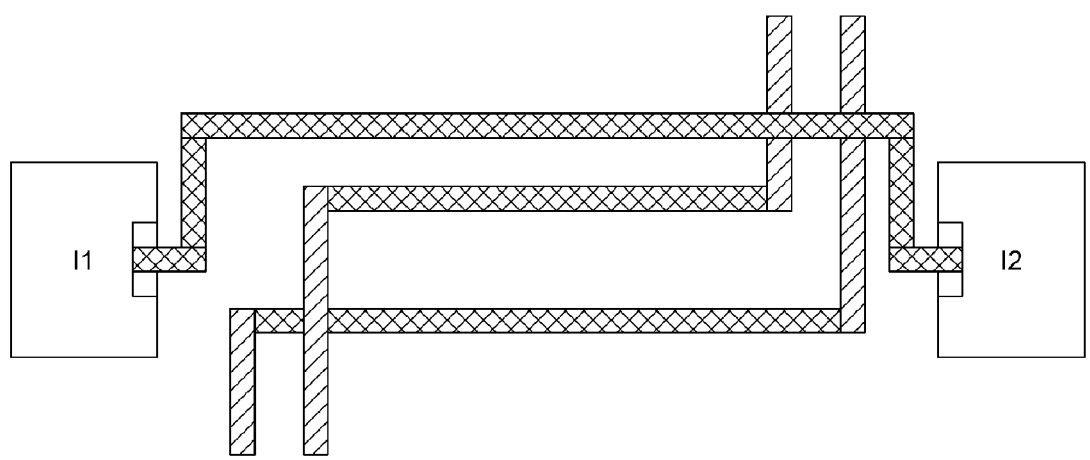
FIG. 7 shows the effects of constraint driven routing.

In FIG. 7, the interconnect between cells I1 and I2 is moved to increase its spacing with respect to the other interconnects. This reduces parasitic capacitance. The critical path will have reduced parasitic capacitance, and timing performance will improve.

The invention provides an automated technique to generate interconnect in a constraint-driven way. For example, the router will generate interconnect to account for timing performance requirements specified for one or more signal paths of an integrated circuit design. In an embodiment, this technique is implemented using a software program executing on a computer workstation. The performance requirements may be specified by a user or circuit designer.

Although this patent application discusses parasitic capacitance as an example of a constraint to consider, the invention may be applied to any constraint on the integrated circuit design. The router may take into consideration any constraint parameter such as propagation delay or other timing, capacitance, resistance, inductance, impedance, current, voltage, IR drop, and many others. A constraint that user wants the router to consider may be entered using a Boolean, regular, or other expression. As examples, a parameter should be within a certain range, above or below a particular value, or other expression. For example, the user may specify a particular signal path should have a propagation delay of 0.5 nanoseconds or less. As another example, the user may specify a load capacitance on a particular interconnect should be 15 femtofarads or less.

The router may consider two or more expressions at time, such as meeting constraints for two different signal interconnect or different constraints for the same interconnect. Further, the router software may give a user an indication of which constraints were satisfied and which constraints were not satisfied. For example, the software may highlight which interconnects do not meet the constraint criteria on the screen for a user to view.

Below is an example of a constraint-driven automated routing flow. This flow is provided merely as an embodiment of the invention. There may be many different possible variations of the flow below without departing from the principles of the invention.

Constraint-Driven Automatic Routing Flow

The invention provides an automatic system for routing a net so that it will more nearly match timing or other parasitic-dependent constraints. In an embodiment, a flow for constraint-driven automatic routing is as follows.

1. Process high-level (system performance) constraints to find critical paths.

2. Analyze constraints to the net level.

3. Estimate the distribution of the parasitics along the course of the net before it is finally routed.

4. Use this estimate to guide the final routing in an intelligent cost driven manner.

5. Measure the parasitics and consequent compliance with the constraint after final routing each net.

6. Apply further steps to improve the routing versus the constraint, and remeasure.

7. If it still fails against the constraint, reroute the net again.

The above approach may be applied in a gridded or gridless (i.e., shape-based) system. One method to implement the first two steps is to global route the design using a lattice of "bins" per routing layer, then extract the parasitics for each net, using the estimated density of wires through the routing bins used by that net (and possibly the bins above and below it, i.e., on neighboring layers) to calculate the parasitics seen by that net in those bin.

Figure 8:
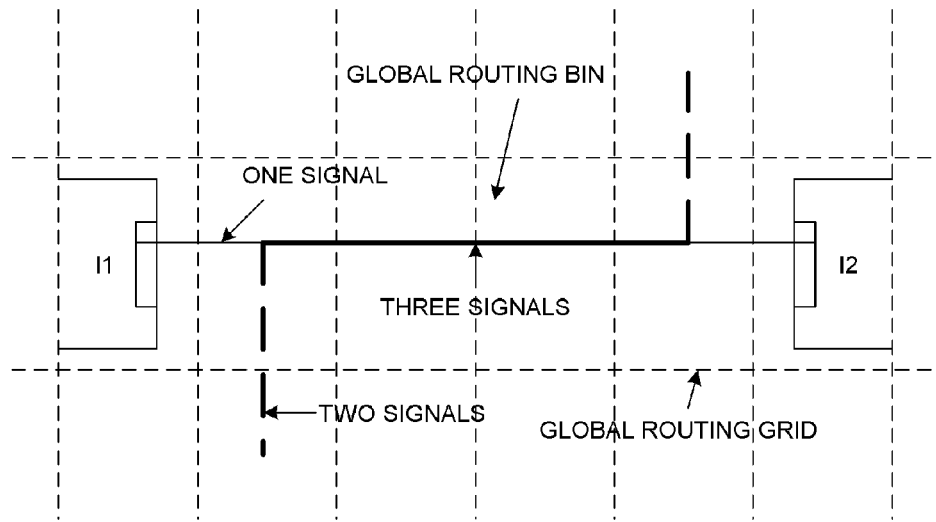
FIG. 8 shows a global routing view of a design.

FIG. 8 shows one method for global routing. First, the design space is divided up into a lattice of bins, either with a regular pitch in X or Y directions, or a variable lattice. The rectangles formed by the lattice are referred to as "bins." In a gridded system, the lattice will be positioned on-grid, so points of the lattice would be at grid points. In a gridless system, the lattice may be positioned anywhere in the layout since there is no grid.

Next, the available routing resources for each metal layer in each bin are measured. Then each net is routed through the lattice from each source to each sink, using a costing mechanism which penalizes using more resource in a bin than was measured as being available. After each net is routed, the resource required for that net is removed from the free amount marked on each bin by the resource measurement step. Costs can also be applied to manage via count, wiring density and other secondary characteristics of the wiring produced.

At the end of each pass, any bins that have too much resource being taken are then targeted for rerouting in the next pass, where nets that use each congested bin are successively rerouted with a higher penalty for using too much resource. Thus over a sequence of passes the nets of the design are assigned paths which use no more than the available resource at all parts of the design while approaching as close as possible to the shortest path for each net.

Note that the paths assigned at this stage only approximate legal paths for the final routing.

To estimate the parasitics of the nets, we know the center line path of the net and the expected resource usage along that path. For each bin along the path, the amount of free resource is divided by the number of nets scheduled to route through that bin and thus the amount of free space per net is found. This is added to the minimum space needed to legally route the net and thus the space expected between each net and its neighbors is derived. This spacing figure, along with estimated densities of wiring on adjacent layers and the distance through the bin that the net is expected to run allows the calculation of resistance, capacitance, and other parasitic values for the net.

Once all parts of the net have estimated parasitics assigned, then a full net timing (or other constraint) estimate is performed upon it. This will give an estimate for how well the net will meet its constraints, and as a side effect of the calculation, also yields the contribution to the total value (e.g., delay) due to each bin in the net and also the sensitivity of the overall delay to changes in the parasitic components measured in that bin.

Figure 9:
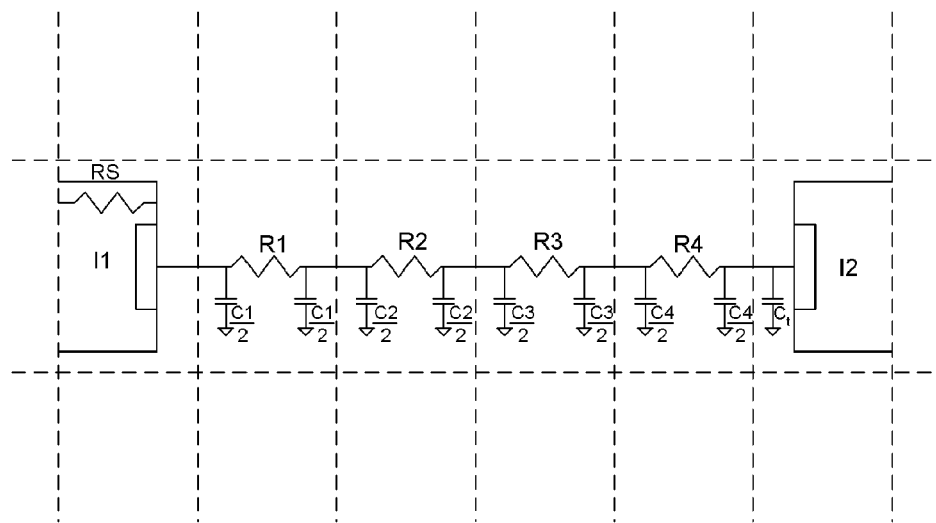
FIG. 9 shows a parasitics view of global routing.

In the case of RC delay, the global routing bins for a given net will have series resistance and parallel capacitance values estimated, and the overall delay of the net will be calculated in units of time (T). In FIG. 9, the values for the routing bins are shown. The Elmore delay estimate for the path from I1 to I2 is:

$$T=Rs*(C1+C2+C3+C4+Ct)+R1*((C1/2)+C2+C3+C4+Ct)+R2*((C2/2)+C3+C4+Ct)+R3*((C3/2)+C4+Ct)+R4*((C4/2)+Ct)$$

This equation will be referred to as formula 2a in this application. Rs is the equivalent source resistance of the driver and Ct is the equivalent capacitance of the receiver, and each segment resistance only drives half the capacitance of that segment.

The equation can also be written as:

$$T=C1*(Rs+(R1/2))+C2*(Rs+R1+(R2/2))+C3*(Rs+R1+R2+(R3/2))+C4*(Rs+R1+R2+R3+(R4/2))+Ct*(R1+R2+R3+R4)$$

This equation will be referred to as formula 2b is this application. Note that other parasitic models can be used (for instance, pi networks for each bin) and other delay estimators can also be used (for instance asymptotic waveform evaluation or AWE).

In the example, the values of C2 and C3 will be larger than those for C1 and C4 due to the higher resource use throughout the width of the bin. The resistance values will be roughly equal for all four bins. The value T thus calculated is the estimated delay for the whole net and can be compared with the constraint for the net. Alternatively, all net parasitics are extracted or estimated and a global analysis such as STA can show which nets are in critical or near critical paths and can allocate budgetary constraint values for each net. Using this, the criticality of the net can be established, and a weighting can be derived by which the value of reducing the delay of this net to the overall performance of the circuit can be expressed. This means that noncritical nets will be routed in a minimal length fashion, while the most critical nets will be routed in a constraint sensitive fashion.

In addition, we have derived budgetary values for the parasitics in each bin, using which we can estimate error values as the routing progresses.

The contribution to this overall time due to each bin is available as sensitivities of the overall delay value (T) to changes in the R and C values for that bin (i.e., dT/dR and dT/dC). In the example, the sensitivity to errors in resistance (i.e., deviations from the budgetary figure) in the leftmost bin of the path is the weighting for R1 in formula 2a, i.e., C1/2+C2+C3+C4, similarly the sensitivity to errors in the capacitance in the first bin is the weighting for C1 in formula 2b, i.e., R1/2. Thus it can be seen that typically errors in resistance are more critical at the source end of the net, and errors in capacitance are more critical towards the sink end of the net. Hence, the relationships, dT/dR1 and dT/dC1, are as follows. The equation for dT/dR1 will be referred to as formula 3, and the equation for dT/dC1 will be referred to as formula 4. Note that in other interconnect delay models the formula may be different but the computed values will be similar to a first order approximation.

$$dT/dR1=C1/2+C2+C3+C4$$

$$dT/dC1=R1/2$$

By deriving local budgetary and sensitivity figures, we enable the routing algorithm to estimate the consequences of decisions it makes locally, rather than having to reconstruct a full parasitic tree at each step and calculating the delay error for the full net. This greatly reduces the time taken in the algorithm. In other words, the invention localizes the problem so that at each decision point the algorithm can estimate the impact on the whole net's timing and potentially the whole circuit's critical path.

The same estimates could be derived without global routing, but the information derived should be stored in a spatial manner for each net so that the budget and sensitivity values for the relevant parasitics can be derived at any point in space that the router may be searching through for its solution. Other methods for deriving such information might use the minimum spanning tree (MST) or Steiner tree estimations of the paths of the routing.

A Steiner tree is a distance graph which spans a given subset of vertices (Steiner points) with the minimal total distance on its edges. In the seventeenth century, French mathematician Pierre Fermat asked how we could find a point P in a triangle with the distances from P to the vertices being as small as possible. This problem was later solved by Toricelli. The Steiner problem is a generalization of this question allowing for an arbitrary number of initial vertices and an arbitrary number of vertices to be added. Even more simply stated, the Steiner problem is to join a set of points with the smallest collection (i.e., smallest total length) of connections. Steiner tree creation should be very efficient and will necessarily be a heuristic algorithm as Steiner tree creation is NP complete. Heuristic algorithms have been designed to approximate the result within polynomial time.

Various Steiner tree algorithms exist today. Mostly these are from academic research. One approach is referred to as the "batched greedy algorithm" (BGA), worked on by Kahng, Mandiou, and Zelikosky. However, in other implementations of the invention, other Steiner tree algorithms may be used including Prim's algorithm and Kruskal's algorithm.

Figure 10:
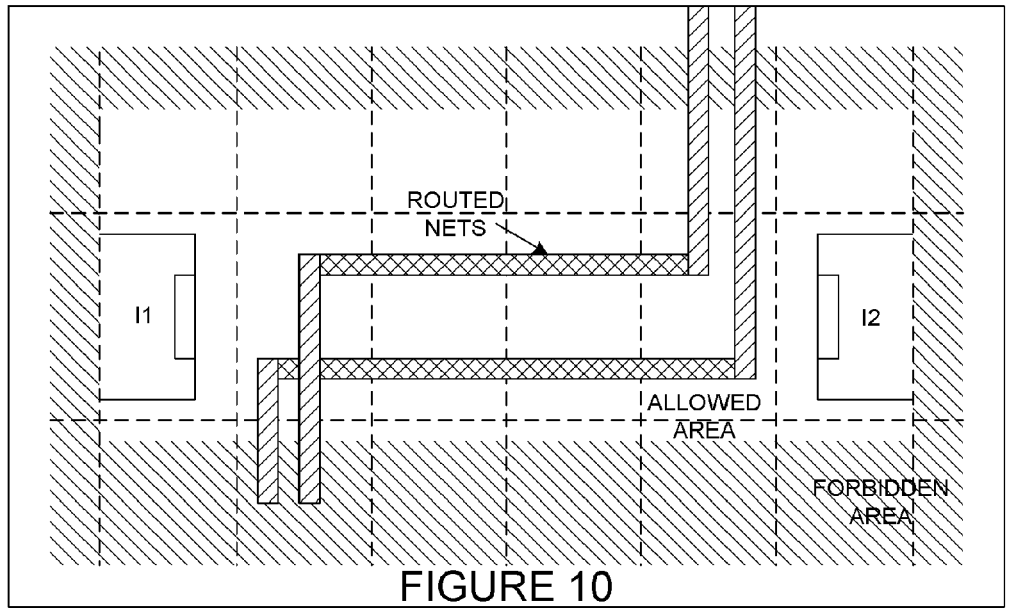
FIG. 10 shows using global routing to guide detailed routing.

FIG. 10 shows one method to implement step 3 of the flow above, which is to use the path determined by the global router to guide the detailed router. This can be done in many ways. For example, the global routing bins not on the global routing path for a net can be turned into obstacles for the autorouter. This causes the autorouter to find a solution that lies within the global routing path.

Figure 11:
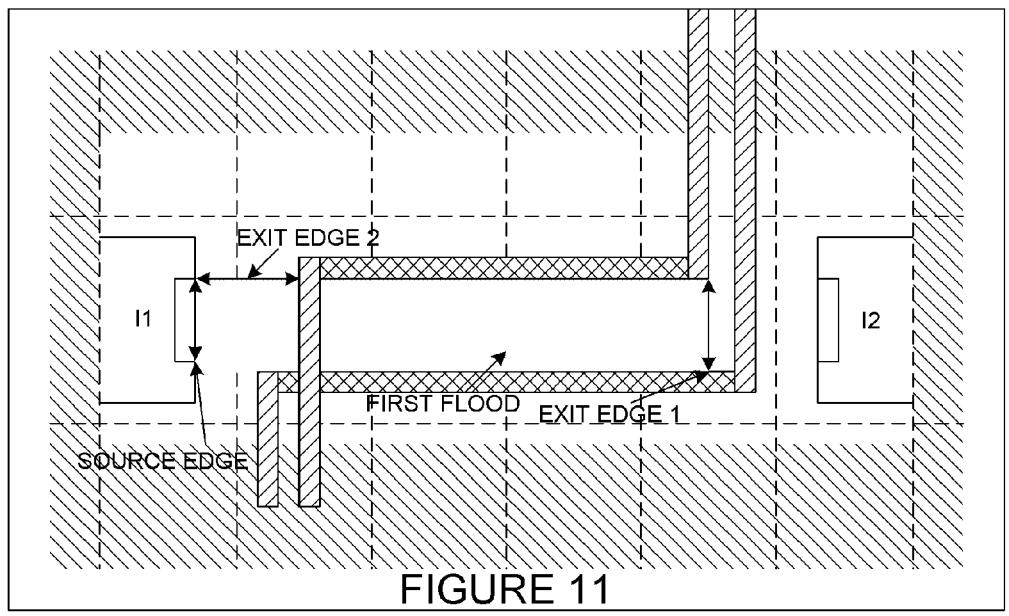
FIG. 11 shows a flooding phase of detailed routing.

FIG. 11 shows part of the flooding phase of the automatic detailed routing mechanism. A source edge has been formed on the side of the source pin nearest the sink. This has then been expanded to the east side.

There are two components of the costing mechanism that are relevant to constraint driven routing: the cost of reaching the current point, and the estimated cost of proceeding from that point to a target point. Both of these cost terms (or cost factors) are normally based on spatial and heuristic factors aimed at minimizing wire length, via count and congestion. When constraint driven routing is operative, then both of these cost terms can be altered to have additional terms due to trying to meet the overall constraint.

In the example, exit edges have been found from this expansion area, where an exit edge is part of the periphery of the area which is legal to route through without violating against another signal or obstacle. Exit edge 1 is normally preferred as it is geometrically very close to the eventual target, and exit edge 2 is normally not preferred both because it is a long way from the target and also involves heading away from the target before getting any closer. Thus in normal routing, the path will progress through the narrow gap between the two other signals and thus will have a large capacitance.

In constraint-driven routing, we estimate for each exit edge the timing error due on the path to that edge. Exit edge 1 has a large estimated capacitance due to being a narrow flood (this implies obstacles on either side are close) and also the flood is long. The sensitivity to capacitance error is higher in the bins towards the right, so the total error is calculated using each of the bins within the flood in turn. The error is calculated as:

$$\text{Timing Error} = (\text{estimated } R\text{-budget } R) \cdot dT/dR + (\text{estimated } C\text{-budget } C) \cdot dT/dC$$

This equation will be referred to as formula 5. Note that as the timing error becomes negative, then it can be treated as zero in the error cost calculations, or the cost weighting can be reduced so that the minimum length criterion again dominates.

The total timing error for the path to exit edge 1 is the sum of the error at the entry edge to the expansion (in this case the source edge) and the errors for each bin within the flood. The timing error is used to derive an timing error cost for the edge, using factors derived from the total estimated path time (T in formulas 2a and 2b), the criticality of the net to the circuit's performance, the routing pass and possibly other factors. Other factors may include, for instance, the importance of meeting the constraint versus meeting the router's other criteria (minimal length, and so forth).

The same procedure may be used to derive an error cost for exit edge 2. In this case the edge comes from a short path with no high capacitances and so its timing error cost is near zero.

In this case it is seen that the lowest cost edge point to expand next can be exit edge 2 rather than exit edge 1 if the timing error cost term of exit edge 1 is large enough to outweigh the router's natural target preference. This will lead to the subsequent flood expansions being as shown in FIG. 12.

Having reached the sink end of the net with expansions, the router can then choose the best backtrack path through the edges so as to minimize wiring and timing cost.

Figure 12:
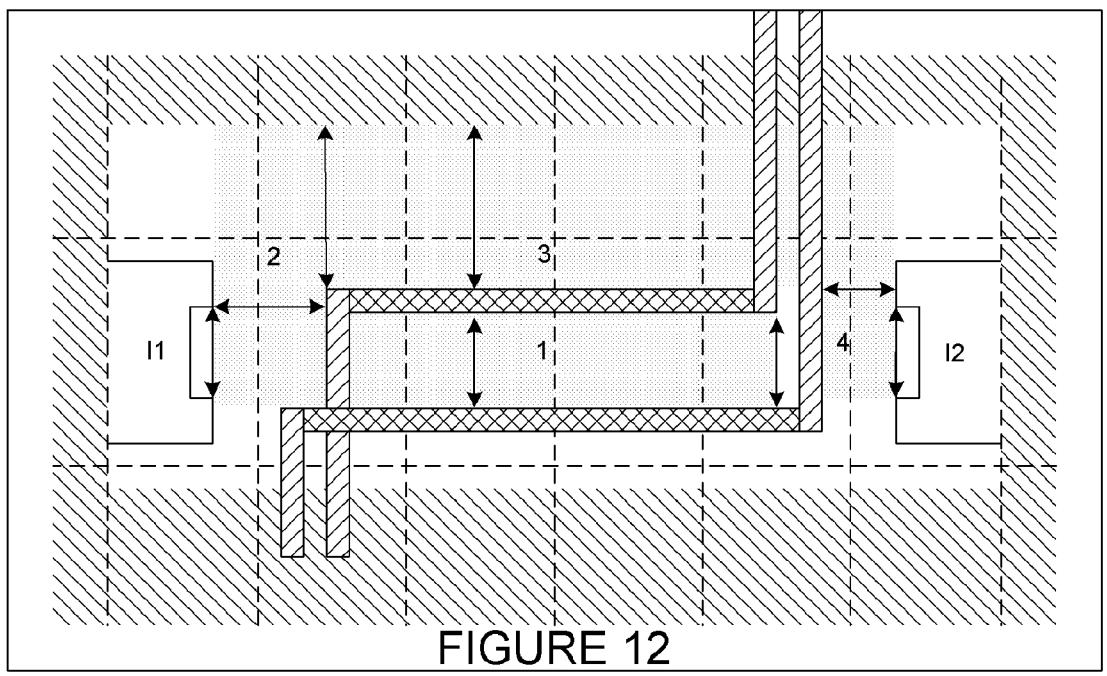
FIG. 12 shows a further flooding phase of detailed routing.

Thus FIG. 12 shows how the increased cost due to local parasitic estimations allows the router to find a solution that solves a global timing problem—for instance, using the path shown in FIG. 7.

The cost of routing from the current point to the target can be increased similarly by estimating the forward path length and the likely parasitics that will be incurred by that path.

By this mechanism each choice point will have a cost associated with it that has a component due to the error in meeting the overall constraint caused by taking a path through that point. This additional cost will then increase the likelihood of the cost driven router choosing to take a path that will have a lower error value against the overall constraint, but which may have a longer wiring length than the router would normally choose had the mechanism not been present.

Using the mechanism described above, the router can estimate the cost of going through the narrow gap versus going around the far side of the obstacles. The router can choose to take a longer path with lower overall parasitics and thus meet the timing constraint: even though the length of the path is greater, the delay is less.

Steps 4 and 5 of the above flow can be implemented as follows. Having routed a net using the mechanism described above, the system can measure the parasitics of the net. If the net still fails its constraints then further measures can be applied to reduce the parasitics that cause that failure.

If the failure is due to excessive resistance in a particular part of the net (typically near the source) then the net can be increased in width ("fattened") in the relevant area, again optionally using the sensitivity values derived earlier to determine the sections of the net where this is relevant. This may need to push neighboring wires aside and also need to be an iterative process where extraction, timing analysis and curative action occur in a loop, attempting to minimize error against the constraint while making the smallest change to the wiring.

If the failure is due to excessive capacitance in a particular part of the net (typically near the sink) then the net can be moved further away from its near neighbors ("space to timing") in the relevant area, again optionally using the sensitivity values derived earlier to determine the sections of the net where this is effective, as shown in FIG. 6.

Step 6 can be implemented by measuring the parasitics and timing of the net either just after routing it, or after all other nets in the area have been routed, then if any net still fails its constraints due to excessive parasitics it can be scheduled to be removed ("ripped up") and rerouted in the next pass of the autorouter algorithm, even if the net otherwise meets all design rules and connectivity requirements. On subsequent passes, for nets that only fail timing constraints, the weighting of timing errors can be increased so that a longer but quicker path that was previously ignored may now be explored.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
providing an integrated circuit layout comprising a driving cell and a receiving cell, which are to be automatically routed together using a net;
using a processor, estimating parasitics for a course of the net;
after estimating parasitics, generating a first segment of the net;
using the estimated parasitics, determining a second segment of the net;
providing a constraint rule for the net;
evaluating whether the net satisfies the constraint rule; and
if the constraint rule is not satisfied, altering the routing of the net comprising increasing spacing between the net and an adjacent net.

2. The method of claim 1 wherein the constraint rule comprises a timing constraint.

3. The method of claim 1 wherein the estimating parasitics for a course of the net comprises dividing the layout into a lattice of bins.

4. The method of claim 3 wherein the estimating parasitics for a course of the net comprises estimating parasitics for each bin.

5. The method of claim 3 further comprising determining sensitivity values for each bin.

6. The method of claim 1 wherein the estimating parasitics for a course of the net comprises dividing the course into a plurality of bins and determining parasitic values for the bins.

7. The method of claim 6 wherein the bins are variably sized.

8. The method of claim 1 wherein the parasitics comprise resistance and capacitance values.

9. The method of claim 1 wherein the determining a second segment of the net occurs after generating a first segment of the net.

10. A method comprising:
providing an integrated circuit layout comprising a driving cell and a receiving cell, which are to be automatically routed together using a net;
using a processor, estimating parasitics for a course of the net;
after estimating parasitics, generating a first segment of the net; and
using the estimated parasitics, determining a second segment of the net,
wherein the generating a first segment of the net comprises generating a first flood having at least two exit edges, and
wherein using the estimated parasitics, determining a second segment of the net comprises comparing timing delays of a first path using a first exit edge of the first flood to a second path using a second exit edge of the first flood, and selecting either the first path or the second path as the second segment based on the comparison of the timing estimates.

11. The method of claim 10 comprising:
providing a constraint rule for the net;
evaluating whether the net satisfies the constraint rule; and
if the constraint rule is not satisfied, altering the routing of the net comprising increasing spacing between the net and an adjacent net.

12. The method of claim 10 comprising:
providing a constraint rule for the net;
evaluating whether the net satisfies the constraint rule; and
if the constraint rule is not satisfied, altering the routing of the net widening the net.

13. A method comprising:
providing an integrated circuit layout comprising a driving cell and a receiving cell, which are to be automatically routed together using a net;
using a processor, estimating parasitics for a course of the net;
after estimating parasitics, generating a first segment of the net; and
using the estimated parasitics, determining a second segment of the net comprising generating a flood.

14. The method of claim 13 comprising:
providing a constraint rule for the net;
evaluating whether the net satisfies the constraint rule; and
if the constraint rule is not satisfied, altering the routing of the net.

15. The method of claim 14 wherein the altering the routing of the net comprises increasing spacing between the net and an adjacent net.

16. The method of claim 14 wherein the altering the routing of the net comprises widening the net.

17. The method of claim 13 wherein the estimating parasitics for a course of the net comprises dividing the layout into a lattice of bins.

18. The method of claim 13 wherein the estimating parasitics for a course of the net comprises dividing the course into a plurality of bins and determining parasitic values for the bins.

19. A method comprising:
providing an integrated circuit layout comprising a first cell and a second cell, which are to be automatically routed together using a net;
using a processor, estimating parasitics for a course of the net;
after estimating parasitics, generating a first flood for the net starting from the first cell; and
using the estimated parasitics, generating a second flood for the net, starting from one edge of the first flood one of at least two exit edges of the first flood.

20. The method of claim 19 wherein the first exit edge is farther away from the second cell than the second exit edge, and the second flood starts from the first exit edge.

21. The method of claim 19 further comprising:
providing a constraint rule for the net;
evaluating whether the net satisfies the constraint rule; and
if the constraint rule is not satisfied, altering the routing of the net.

22. The method of claim 21 wherein the altering the routing of the net comprises increasing spacing between the net and an adjacent net.

23. The method of claim 21 wherein the altering the routing of the net comprises widening the net.

24. A method comprising:
providing an integrated circuit layout comprising a first cell and a second cell, which are to be automatically routed together using a net;
using a processor, estimating parasitics for a course of the net;
using the estimated parasitics, generating the net comprising generating a flood;

evaluating whether the placement for the net satisfies a constraint rule; and if the constraint rule is not satisfied, widening the net.

25. The method of claim 24 wherein the estimating parasitics for a course of the net comprises dividing the layout into a lattice of bins.

26. The method of claim 24 wherein the estimating parasitics for a course of the net comprises dividing the course into a plurality of bins and determining parasitic values for the bins.

* * * * *